United States Patent

Hamada

Patent Number: 6,130,027
Date of Patent: Oct. 10, 2000

[54] PROCESS FOR PRODUCING LEAD FRAMES

[75] Inventor: Yoichiro Hamada, Ohkuchi, Japan

[73] Assignees: Sumitomo Metal Mining Co., Ltd., Tokyo, Japan; Possehl Sumiko Electronics Singapore PTE Ltd., Jurong, Singapore

[21] Appl. No.: 09/018,475

[22] Filed: Feb. 4, 1998

[30] Foreign Application Priority Data

Feb. 13, 1997 [JP] Japan .................................. 9-044762

[51] Int. Cl.⁷ ...................................................... G03F 7/00
[52] U.S. Cl. ........................ 430/312; 430/314; 430/316; 216/14
[58] Field of Search ..................... 430/312, 314; 436/316; 216/14, 41

[56] References Cited

U.S. PATENT DOCUMENTS

| | | | |
|---|---|---|---|
| 3,960,561 | 6/1976 | Haining | 96/36.2 |
| 4,983,252 | 1/1991 | Masui | 156/630 |
| 5,834,159 | 11/1998 | Stolmeijer | 430/312 |
| 5,945,259 | 8/1999 | Kim | 430/316 |

*Primary Examiner*—Sharon Gibson
*Assistant Examiner*—Nicole Barreca
*Attorney, Agent, or Firm*—Watson Cole Grindle Watson, P.L.L.C.

[57] ABSTRACT

A process for producing lead frames having lead tips with a minimum of side etching includes the steps of coating a metal lead frame substrate with a first photosensitive film, patterning the first photosensitive film, developing the patterned first photosensitive film, partially etching the metal surface of the lead-frame substrate beneath the developed patterned first photosensitive film, coating the partially etched metal surface with a positive second photosensitive, exposing the positive second photosensitive film to light passing through the developed first photosensitive film, developing the exposed second photosensitive film, performing fine etching through the developed second photosensitive film to a desired depth at least once, and removing the first and second photosensitive films.

5 Claims, 2 Drawing Sheets

PRIOR ART

PROCESS FOR PRODUCING LEAD FRAMES

BACKGROUND OF THE INVENTION

1. Field of the Invention

The present invention relates to a process for producing lead frames for semiconductor devices, the lead frames having extremely finely patterned lead tips.

2. Description of Related Art

The increasing degree of integration in semiconductor chips requires lead frames having lead tips arranged at narrower intervals than ever before so that it can provide a large number of pins. (The lead frame connects the semiconductor chip to external circuits for exchanging electrical signals and permits the mounting of the semiconductor chip.) There are two methods available now for producing lead frames—stamping with a die and pattern etching with a photoresist.

Stamping is suitable for mass production once a die is completed, whereas etching is suitable for production of a variety of products, each in small quantities, because it permits design to be made or changed in a short time. Another advantage of etching is its capability of fine patterning. Unfortunately, etching is subject to so-called side etching, which is a phenomenon that etching takes place not only in the direction of the thickness of the lead frame substrate but also in the direction perpendicular to the thickness. The consequence of side etching is that finely patterned lead frame tips have a flat width narrower than designed. Therefore, the current lead frame produced by etching has tips as shown in FIG. 2. In the case of a lead frame having a pitch ($\alpha$) of 170 $\mu$m, the accuracy of finishing is limited to 75 $\mu$m for the flat width ($\beta$) and 80 $\mu$m for the lead space ($\gamma$).

OBJECT AND SUMMARY OF THE INVENTION

It is an object of the present invention, which was completed to address the above-mentioned problem, to provide a process for producing extremely finely patterned lead frames without causing side etching.

According to the present invention, the above-mentioned problem is solved by performing etching in multiple stages after resist patterning for the production of extremely finely patterned lead frames. To be more specific, the gist of the present invention resides in a process for producing lead frames which includes the steps of protective film coating, patterning, development, partial etching, coating the partially etched metal surface with a positive photoresist, exposing the photoresist to light, developing the photoresist, performing fine etching to a desired depth at least once, and removing the resist. The positive photoresist should preferably be an ED (electrodeposition) resist.

Owing the above-mentioned steps, the process of the present invention prevents side etching in the production of lead frames and makes it possible to produce the most extremely finely patterned lead frames ever produced.

DESCRIPTION OF THE PREFERRED EMBODIMENTS

The process of the present invention is characterized by multistage etching. It starts with laminating a photosensitive film (as a protective film) onto the lead frame substrate. The photosensitive film is exposed to light through a patterned mask placed thereon. The film is developed and then patterned. The lead frame undergoes partial etching. The etched metal surface is coated with a photoresist, which is subsequently patterned. Etching is performed again at least once. Finally, the resist is removed. The above-mentioned individual steps of masking, exposure, development, and etching are the same as those used for the production of conventional lead frames.

Figure 1:
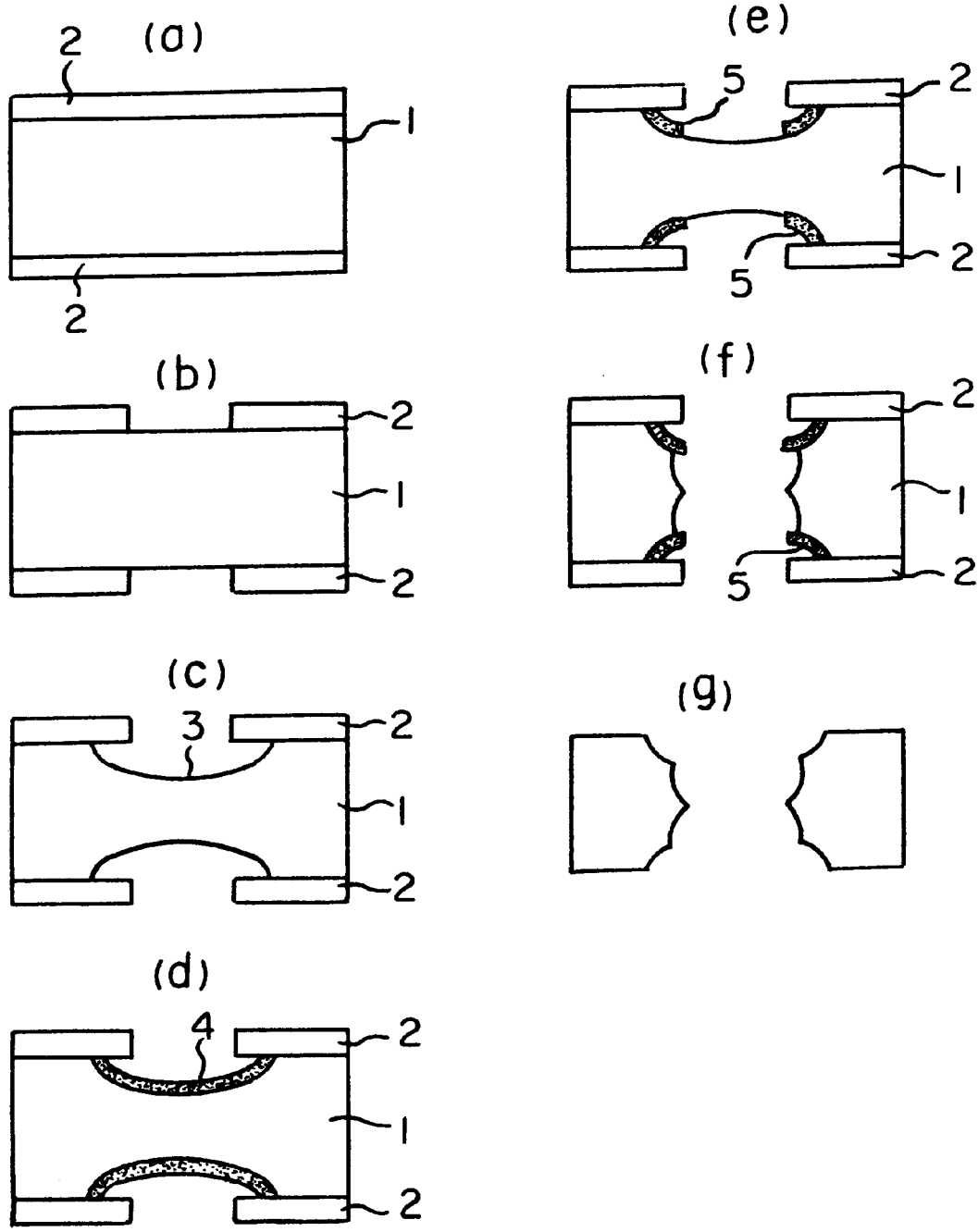
FIG. 1 is a sectional view showing sequential steps (a) to (g) in one embodiment of the present invention.
Figure 2:
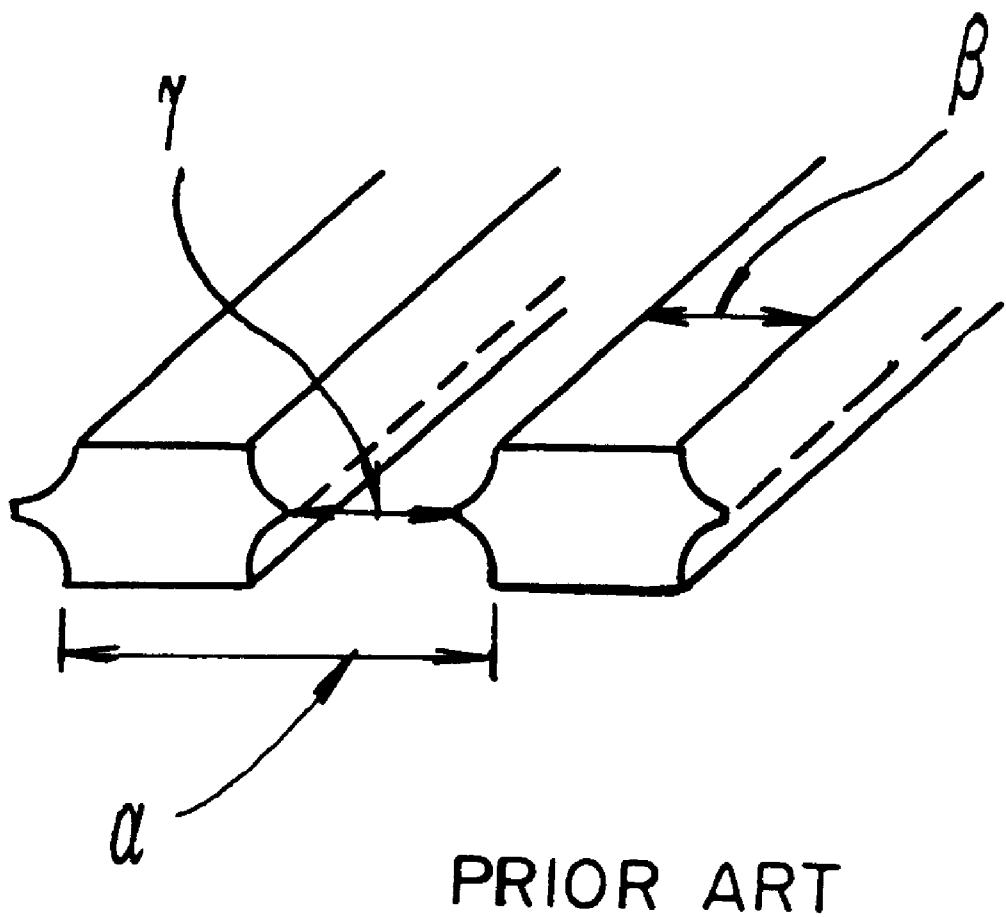
FIG. 2 is a perspective view showing the lead frame tips produced by the conventional etching process.

The process of the present invention for producing extremely finely patterned lead frames will be concretely explained below with reference to FIG. 1.

In step (a), the lead frame substrate 1 is covered by lamination with a photosensitive film 2. In step (b), the photosensitive film 2 is exposed to light through a patterned mask placed thereon and then developed for patterning. In step (c), the lead frame substrate is partially etched. In step (d), the etched surface 3 is coated with a positive resist, which upon drying forms a photosensitive coating film 4.

The above-mentioned positive resist may be either an ordinary positive resist or an ED (electrodeposition) resist. The former covers the entire surface of the lead frame whereas the latter covers only the exposed metal part and hence meets the purpose in a less amount. The resist coating may be accomplished by spin coating, spraying, or electrodeposition, depending on the kind of resist used.

In step (e), the photosensitive coating film 4 is exposed to light (by using the photosensitive film 2 as a mask), developed, and patterned, so as to form side etching preventing films 5 at both sides of the etched surface. Etching is resumed to give the desired configuration as shown in (f). Any conventional etching liquid may be used in step (e).

After etching is complete, the resist is removed and there is obtained the desired lead frame having a cross section as shown in (g).

EXAMPLE 1

A 0.15-mm thick lead frame substrate (of copper alloy) was covered on both sides by lamination with a photosensitive dry film (H-K815 from Hitachi Kasei), which was subsequently exposed to light through a mask placed thereon which has a pattern of a lead frame with a 150-$\mu$m pitch. After development, etching with an aqueous solution of cupric chloride was performed on both sides up to a depth of about 50 $\mu$m (each side). The etched surfaces were spin-coated (at about 1000 rpm) with a positive resist (PMER from Tokyo Ouka). After drying at 90° C. for 10 minutes, the resulting photosensitive film was exposed to light (about 30 mJ/cm$^2$) using the photosensitive dry film as a mask and then developed for patterning with a 1% aqueous solution of sodium carbonate. Thus the etched surfaces were partly covered with film to prevent side etching. Etching was resumed with an aqueous solution of cupric chloride until a desired configuration was obtained. The resist was removed by the aid of 3% aqueous solution of sodium hydroxide. After rinsing and drying, there was obtained the desired lead frame.

EXAMPLE 2

Etching (up to a depth of about 50 $\mu$m of each side) was performed on both sides in the same manner as in Example 1. The etched surfaces were coated with ED resist (from Nippon Paint) by electrodeposition for 5 seconds at 200 V and 100 mA. After rinsing and drying, the resist film was exposed to light (about 30 mJ/cm$^2$) and then developed for patterning with a 1% aqueous solution of sodium metasilicate. Etching was performed again in the same manner as in Example 1 until the desired configuration was obtained. After removal of resist, rinsing, and drying, there was obtained the desired lead frame.

EXAMPLE 3

Etching (up to a depth of about 30 μm of each side) was performed on both sides in the same manner as in Example 1. Coating with ED resist and ensuing exposure and development were carried out in the same manner as Example 2. Etching (up to a depth of 30 μm on each side) was performed again. The etched surfaces were coated again with ED resist, which was subsequently exposed and developed for patterning. Etching was performed again in the same manner as in Example 1 until the desired configuration was obtained. After removal of resist, rinsing, and drying, there was obtained the desired lead frame.

The 150-μm pitch lead frames obtained in the above-mentioned examples were examined for the dimensions of their tips. The results are shown in Table 1 in comparison with those of lead frames made by the conventional etching process. The dimensions measured are the flat width of each tip and the space between leads. A large flat width and a small space signify that the process is capable of extremely fine patterning for the lead frame.

TABLE 1

| | Flat width of lead tip | Space between leads |
|---|---|---|
| | unit (μm) | |
| Conventional process | 55 | 60 |
| Example 1 | 88 | 56 |
| Example 2 | 93 | 52 |
| Example 3 | 95 | 53 |

It is noted from Table 1 that in the case of lead frame produced by the conventional process, the flat width of lead tip is 55 μm (on average) and the space between leads in 60 μm (on average), whereas in the case of lead frames in Example 1 and 2, the flat width of lead tip is 88 and 93 μm (on average), respectively, and the space between leads is 56 and 52 μm (on average), respectively. The large differences (33–38 μm in flat width and 4–8 μm in lead space) suggest the great improvement in etching accuracy by the present invention.

It is also noted that further improvement is made in Example 3 as indicated by the flat width of 95 μm and the lead space of 53 μm. In other words, repeating etching more than once according to the present invention results in a greater etching accuracy.

The process of the present invention produces the effect of preventing side etching, thereby permitting the production of extremely finely patterned lead frames which has never been achieved by the conventional technology. In addition, it can be applied to the fine patterning of metal by etching as well as the production of lead frames for semiconductor devices.

What is claimed is:

1. A process for producing lead frames with a minimum of side etching which comprises the sequential steps of (a) coating a metal lead frame substrate with a first photosensitive film, (b) exposing the first photosensitive film to provide a patterned first photosensitive film, (c) developing the patterned first photosensitive film to provide openings therein, (d) partially etching the surface of the metal lead frame beneath the openings in the developed first photosensitive film, (e) coating the partially etched metal surface of the metal lead frame with a positive second photosensitive film, (f) exposing the positive second photosensitive film to light passing through the openings in the developed first photosensitive film, which functions as a mask, (g) developing the exposed second photosensitive film to provide openings therein, (h) performing fine etching of the metal lead frame substrate beneath the openings in the second photosensitive film to a desired depth at least once, and (i) removing said first and second photosensitive films.

2. A process for producing lead frames as defined in claim 1, wherein said positive second photosensitive film is an ED (electrodeposition) resist.

3. A process for producing lead frames as defined in claim 1, wherein said positive second photosensitive film is applied by spin coating, spraying, or electrodeposition.

4. A process for producing lead frames as defined in claim 1, wherein in step (a) the first photosensitive film is laminated onto the surface of the metal lead frame substrate.

5. A process for producing lead frames as defined in claim 1, wherein in step (b) the first photosensitive film is exposed to light passing through a patterned mask placed thereon.

* * * * *